United States Patent
Hashimoto

(10) Patent No.: US 6,486,544 B1
(45) Date of Patent: Nov. 26, 2002

(54) SEMICONDUCTOR DEVICE AND METHOD MANUFACTURING THE SAME, CIRCUIT BOARD, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/530,609

(22) PCT Filed: Sep. 3, 1999

(86) PCT No.: PCT/JP99/04785

§ 371 (c)(1),
(2), (4) Date: May 3, 2000

(87) PCT Pub. No.: WO00/14802

PCT Pub. Date: Mar. 16, 2000

(30) Foreign Application Priority Data

Sep. 9, 1998 (JP) .......................................... 10-272613

(51) Int. Cl.⁷ .............................................. H01L 23/02
(52) U.S. Cl. ........................................ 257/686; 257/777
(58) Field of Search ................................ 257/686, 777, 257/778, 781

(56) References Cited

U.S. PATENT DOCUMENTS

| 5,159,535 A | 10/1992 | Desai et al. |
| 5,450,283 A | 9/1995 | Lin et al. |
| 5,578,525 A | 11/1996 | Mizukoshi |
| 5,646,446 A | 7/1997 | Nicewarner, Jr. et al. |
| 5,773,882 A | 6/1998 | Iwasaki |
| 5,783,870 A * | 7/1998 | Mostafazadeh et al. ...... 257/791 |
| 5,949,142 A * | 9/1999 | Otsuka ......................... 257/737 |
| 5,969,426 A | 10/1999 | Baba et al. |
| 6,071,755 A * | 6/2000 | Baba et al. .................. 438/106 |
| 6,075,287 A * | 6/2000 | Ingraham et al. ........... 257/706 |
| 6,208,521 B1 * | 3/2001 | Nakatsuka ................... 257/706 |
| 6,324,067 B1 * | 11/2001 | Nishiyama ................... 257/723 |

FOREIGN PATENT DOCUMENTS

| EP | 0 460 822 A1 | 12/1991 |
| EP | 0 493 870 A2 | 7/1992 |
| EP | 0 720 419 A1 | 7/1996 |
| JP | A-3-220736 | 9/1991 |
| JP | A-8-321580 | 12/1996 |
| JP | A-10-50931 | 2/1998 |
| JP | A-10-242379 | 9/1998 |
| JP | A-11-40618 | 2/1999 |

OTHER PUBLICATIONS

"Three-Dimensional High Density Packaging", *IBM Technical Disclosure Bulletin*, IBM Corp., New York, vol. 38, No. 1, Jan. 1995, pp. 69–70.

\* cited by examiner

*Primary Examiner*—Phat X. Cao
(74) *Attorney, Agent, or Firm*—Oliff & Berridge PLC

(57) ABSTRACT

A semiconductor device comprises a plurality of semiconductor chips (20, 30) having electrodes (22, 32) and aligned in the horizontal direction; a substrate (10) on which is formed an interconnect pattern (12) having bonding portions (14) connected to the electrodes (22, 32) of the semiconductor chips (20, 30) and lands (16) connected to the bonding portions (14), and external electrodes (40) provided on the lands (16) and connected to the electrodes (22, 32) through an interconnect pattern (12).

10 Claims, 10 Drawing Sheets

SEMICONDUCTOR DEVICE AND METHOD MANUFACTURING THE SAME, CIRCUIT BOARD, AND ELECTRONIC INSTRUMENT

This application is a 371 of PCT/JP99/04785, filed Sep. 3, 1999

TECHNICAL FIELD

The present invention relates to a semiconductor device and method of manufacturing the same, to a circuit board and to an electronic instrument.

BACKGROUND OF ART

In recent years, with the increasing compactness of electronic instruments, the development of multichip modules incorporating a plurality of semiconductor chips at high density is proceeding. With a multichip module, since an existing plurality of semiconductor chips can be used, the cost can be reduced compared with the design of a new integrated circuit.

However, conventional multichip modules have used wire bonding to connect interconnect pattern of a substrate to the electrodes of the semiconductor chip. As a result, the interconnect pattern requires bonding pads for the wires, and therefore the area of the substrate is increased, preventing the required compactness of the package from being fully achieved.

The present invention solves this problems, and has as its object the provision of a compact semiconductor device incorporating a plurality of semiconductor chips at high density and a method of manufacturing the same, of a circuit board and of an electronic instrument.

DISCLOSURE OF INVENTION (1) A semiconductor device of the present invention comprises:

a plurality of semiconductor chips having electrodes, and aligned in a horizontal direction for face-down bonding;

a substrate on which an interconnect pattern is formed, the interconnect pattern having bonding portions to which the electrodes of the semiconductor chip are connected, and lands to which the bonding portions are electrically connected; and external electrodes provided on the lands.

According to this aspect of the present invention, a plurality of semiconductor chips is aligned in a horizontal direction and mounted on a substrate. Each semiconductor chip is subjected to face-down bonding. Since the bonding is carried out within the region where the semiconductor chip is mounted, the area of the substrate can be kept to the minimum required. As a result, the semiconductor device can be made more compact.

(2) In the semiconductor device:

the external electrodes may be disposed within mounting regions of the semiconductor chips.

By means of this, external electrodes can be provided corresponding to the electrodes of the semiconductor chip, within the region where each semiconductor chip is mounted.

(3) In the semiconductor device:

the external electrodes may be disposed outside regions where the semiconductor chips are mounted.

By means of this, the external electrodes can be aligned on the periphery of the substrate.

(4) In the semiconductor device:

the substrate may be a flexible substrate and is formed to be larger than the regions where the semiconductor chips are mounted, and a flat support member may be provided on a periphery of the substrate.

By means of this, even if a flexible substrate is used, the uniform height (coplanarity) of the external electrodes can be assured by means of the flat support member.

(5) In the semiconductor device:

the external electrodes may be disposed within a region where any one of the semiconductor chips is mounted.

By means of this, all of the external electrodes can be provided within the region where any one of the semiconductor chips is mounted, and no external electrodes can be provided within the region where any other semiconductor chip is mounted.

(6) In the semiconductor device:

the substrate may be a flexible substrate and part of the substrate is bent; and a surface of the one semiconductor chip, which is disposed at a region where the external electrodes are provided, opposite to a surface on which the electrodes are formed may be adhered to a surface of at least one remaining semiconductor chip opposite to a surface on which the electrodes are formed.

Since on the semiconductor chip another semiconductor chip is adhered, the size of the semiconductor device in the horizontal direction can be reduced.

(7) In the semiconductor device:

the substrate may have at least one hole formed along a region to be bent.

By forming the hole in the substrate, the resilience of the substrate can be reduced, and the bent state can be more easily maintained.

(8) In the semiconductor device:

the hole may be a slot extending along a bending line;

the interconnect pattern may be formed to pass over the hole; and an edge of the slot extending along the bending line may form a part of an outer edge.

Since a part of the outer edge of the semiconductor device is formed by an edge of the slot, the edge of the semiconductor device can be positioned accurately.

(9) In the semiconductor device:

a plurality of the holes may be formed;

the interconnect pattern may be formed to pass over the plurality of holes; and the plurality of holes may be slots extending along a bending line, and are aligned.

By means of this, the substrate may be made easier to bend. (10) In the semiconductor device:

the substrate may have a slit formed along a region to be bent; and the substrate may be divided by the slit, and a gap may be opened up between opposing divided edges.

When the divided substrate is considered as a whole, it can be bent more easily.

(11) In the semiconductor device:

a joining member may be provided spanning the slit.

By means of this, the bent portion of the substrate can be supported by the joining member.

(12) In the semiconductor device:

a flexible resin may be provided on the interconnect pattern in the hole; and the resin may be bent together with the substrate.

By means of this, the bent portion of the substrate can be supported by the resin.

(13) In the semiconductor device:

the semiconductor chips may be adhered by an electrically conductive adhesive or a thermally conductive adhesive.

When an electrically conductive adhesive is used, the electrical potential of the adhering surfaces of the semiconductor chips can be made the same. When a thermally conductive adhesive is used, cooling can be achieved by passing heat from the semiconductor chip which emits more heat to the semiconductor chip which emits less heat.

(14) In the semiconductor device:

a surface area of one of the semiconductor chips may be larger than a surface area of a remaining semiconductor chip; and the external electrodes may be formed only in a region where the semiconductor chip having a larger surface area is provided.

By means of this, the largest possible region for providing the external electrodes can be assured, without going outside the surface area of the semiconductor chip.

(15) In the semiconductor device:

the electrodes of the semiconductor chips may be connected to the bonding portions by an anisotropically conductive material including conductive particles dispersed in an adhesive.

Since the bonding portions and electrodes are electrically connected by the anisotropically conductive material, a semiconductor device can be manufactured by a method of outstanding reliability and productivity.

(16) A method of manufacturing a semiconductor device of the present invention comprises:

a step of providing a substrate on which an interconnect pattern is formed, the interconnect pattern having a plurality of bonding portions and a plurality of lands electrically connected to the bonding portions, and providing a plurality of semiconductor chips having electrodes;

a step of providing anisotropically conductive materials including conductive particles dispersed in an adhesive at least on the bonding portions;

a step of positioning the electrodes over the bonding portions on the anisotropically conductive materials, and mounting the semiconductor chips over the substrate;

a step of applying pressure to at least one of the semiconductor chips and the substrate so that the bonding portions and the electrodes are electrically connected by the conductive particles; and a step of forming external electrodes on the lands.

According to this aspect of the present invention, a plurality of semiconductor chips is mounted on the substrate, and the electrodes of the semiconductor chips and bonding portions are subjected to face-down bonding. Therefore, since the bonding is carried out within the region where the semiconductor chip is mounted, the area of the substrate can be kept to the minimum required. As a result, the semiconductor device can be made more compact.

Since the bonding portions and electrodes are electrically connected by the anisotropically conductive material, a semiconductor device can be manufactured by a method of outstanding reliability and productivity.

(17) In this method, the substrate may be a flexible substrate and formed to be larger than the regions where the semiconductor chips are mounted; and a flat support member may be provided on a periphery of the substrate.

By means of this, even if a flexible substrate is used, the uniform height (coplanarity) of the external electrodes can be assured. In the case where all of the external electrodes are provided outside the region where all of the semiconductor chips are mounted, the external electrodes can be provided on the region to which the flat support member is attached.

(18) The method may further comprise a step of bending a part of the substrate, after the step of mounting the semiconductor chips on the substrate, so that a surface of one of the semiconductor chips opposite to a surface where the electrodes are provided is adhered to a surface of another of the semiconductor chips opposite to a surface on which the electrodes are formed.

Since on the semiconductor chip another semiconductor chip is adhered, the size of the semiconductor device in the horizontal direction can be reduced.

(19) In this method, the substrate may have at least one hole formed along a region to be bent.

In this way, by forming a hole in the substrate, the resilience of the substrate can be reduced, and the substrate can be made easier to bend.

(20) The circuit board of the present invention has the above described semiconductor device mounted.

(21) The electronic instrument of the present invention has the above described circuit board.

BEST MODE FOR CARRYING OUT THE INVENTION

The present invention is now described in terms of a number of preferred embodiments, with reference to the drawings.

First Embodiment

Figure 1A:
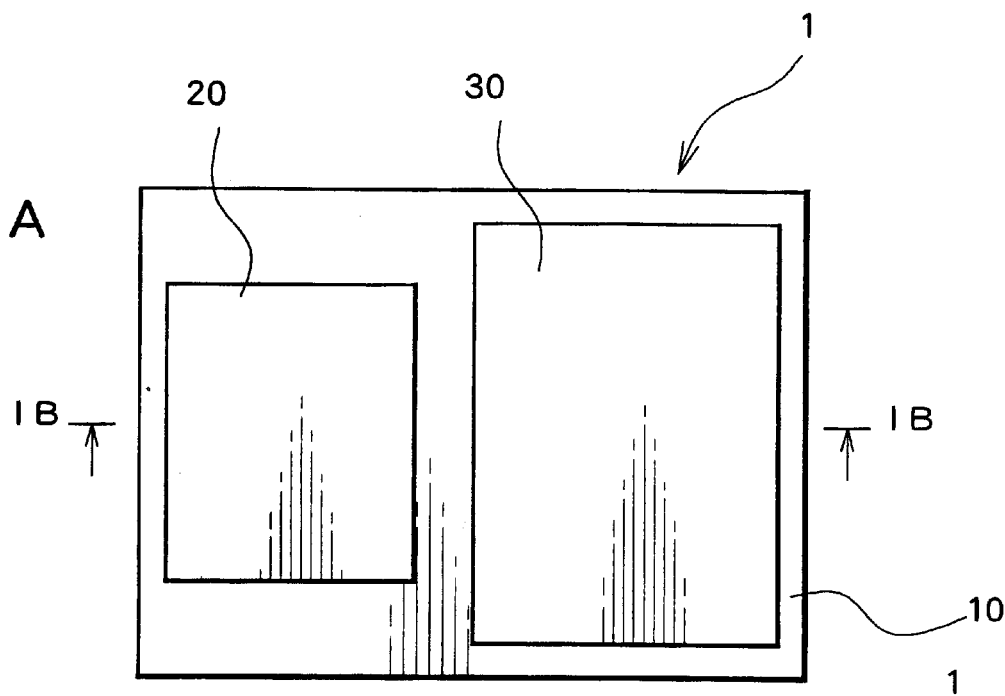
FIGS. 1A to 1C show a first embodiment of the semiconductor device to which the present invention is applied.
Figure 1B:
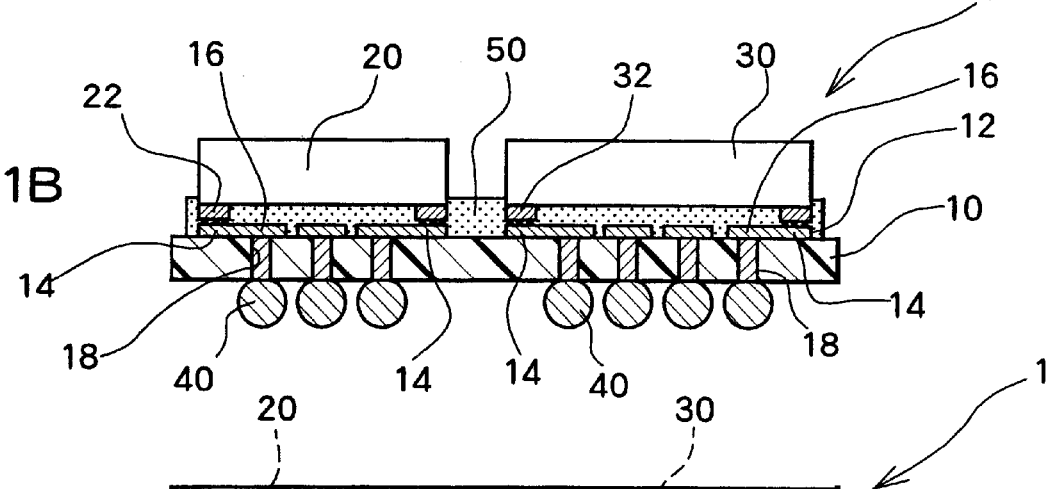
Figure 1C:
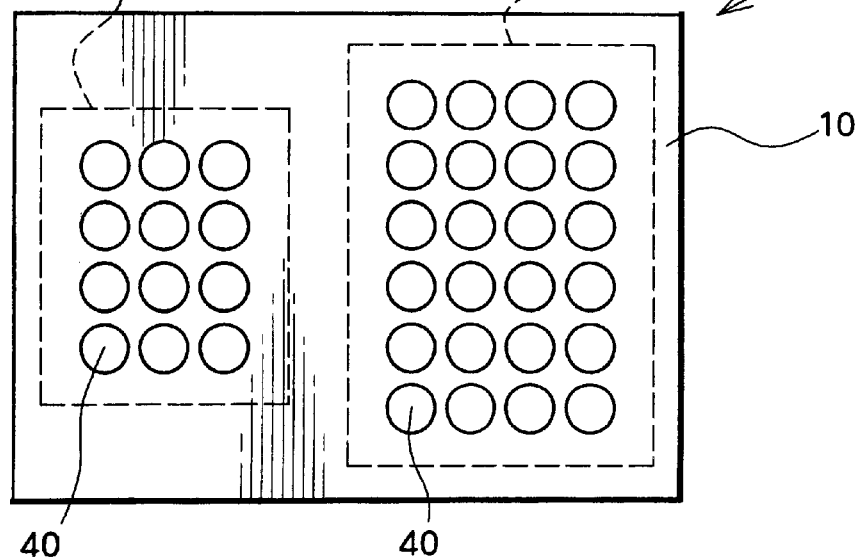

FIGS. 1A to 1C show a first embodiment of the semiconductor device to which the present invention is applied. It should be noted that FIG. 1A is a plan view of the semiconductor device, FIG. 1B is a cross-sectional view along the line IB—IB in FIG. 1A, and FIG. 1C is a bottom view of the semiconductor device. A semiconductor device 1 comprises a substrate 10 a plurality (for example two) of semiconductor chips 20 and 30, and a plurality of external electrodes 40.

The substrate 10 may be formed of either of an organic or inorganic material, or may be a compound construction thereof. As a substrate 10 formed of an organic material may be cited, for example, a flexible substrate formed of a polyimide resin. As a substrate 10 formed of an inorganic material may be cited, for example, a ceramic substrate or glass substrate. As a compound construction of organic and inorganic materials may be cited, for example, a glass epoxy substrate.

On the substrate 10, is formed an interconnect pattern 12. The interconnect pattern 12 is formed on one surface of the substrate 10. It should be noted that in addition to the interconnect pattern 12 formed on the one surface of the substrate 10, an interconnect pattern may also be formed on the other surface.

The interconnect pattern 12 can be formed by covering the substrate 10 with copper or the like by sputtering or the like to form a conductive film, and etching the same. In this case, the interconnect pattern 12 is formed directly on the substrate 10, and forms a two-layer substrate without an intervening adhesive. Alternatively, a three-layer substrate may be used with an adhesive interposed between the substrate 10 and the interconnect pattern 12. Alternatively, a built-up substrate of multi-layer construction may be used, with an insulating resin and interconnect pattern laminated on the substrate, or a multi-layer substrate with a plurality of substrates laminated may be used.

The interconnect pattern 12 includes a plurality of bonding portions 14 and a plurality of lands 16. Each of the bonding portions 14 is electrically connected to at least one of the lands 16. The bonding portions 14 and lands 16 are formed to be larger in area than the interconnect portions. It should be noted that bumps may be formed on the bonding portions 14.

The bonding portions 14 and lands 16 are formed within the mounting region of each of the semiconductor chips 20 and 30 on the substrate 10, and are not formed outside these regions. The bonding portions 14 positioned within the mounting regions of each of the semiconductor chips 20 and 30 are connected to the lands 16 positioned within the respective mounting region. Alternatively, bonding portions 14 positioned within the mounting region of either one of the semiconductor chips 20 and 30 may be connected to lands 16 positioned within the mounting region of the other of the semiconductor chips 20 and 30. To simplify trimming die, the substrate 10 may be formed to be oblong as shown in the drawing, and where even more extreme compactness is required, may be formed along the outline of the semiconductor chip.

In the substrate 10 are formed through holes 18. On the through holes 18 are positioned the lands 16. That is to say, the lands 16 are able to be connected to the surface opposite to the surface of formation of the interconnect pattern 12 through the through holes 18. In this way, on the surface of the substrate 10 opposite to the surface where the interconnect pattern 12 is formed, a plurality of external electrodes 40 (see FIG. 1C) electrically connected to the interconnect pattern 12 can be formed.

The plurality of semiconductor chips 20 and 30 are, for example, flash memory and SRAM, both SRAMs, both DRAMs, memory and ASIC, or an MPU and memory, and have respective pluralities of electrodes 22 and 32. The electrodes 22 and 32 are positioned 20 over some of the bonding portions 14, and are electrically connected through an anisotropically conductive material 50. That is to say, the semiconductor chips 20 and 30 are subjected to face-down bonding to the interconnect pattern 12 of the substrate 10 by facing down the surfaces on which the electrodes 25 22 and 32 are formed. It should be noted that the semiconductor chips 20 and 30 shown in the drawings have different sizes and shapes, but they may equally be of the same size and shape. The electrodes 22 and 32 are commonly gold formed by plating or as wire, but may equally be nickel, solder or suchlike material.

The anisotropically conductive material 50 comprises an adhesive (binder) in which conductive particles (conductive filler) is dispersed, and may also include a dispersant. The anisotropically conductive material 50 may be preformed into a sheet, then adhered to the substrate 10, or may be disposed in liquid form on the substrate 10. A thermosetting adhesive is commonly used as the adhesive of the anisotropically conductive material 50. The anisotropically conductive material 50 is provided at least on the bonding portions 14. Alternatively, when the anisotropically conductive material 50 is provided to cover the whole of the substrate 10, this step can be carried out simply. When the anisotropically conductive material 50 is provided to exclude the periphery of the substrate 10, the anisotropically conductive material 50 will not be attached to the peripheral surface of the substrate 10, which is convenient for the later handling of the substrate 10.

The anisotropically conductive material 50 is squeezed between the electrodes 22 and 32 and the bonding portions 14, and the conductive particles are arranged to provide electrical conduction therebetween. In this embodiment, the semiconductor chips 20 and 30 are subject to face-down bonding. When the face-down bonding is performed, instead of using the anisotropically conductive material 50, any of at least one of light, heat, pressure, and vibration may be used to bond the electrodes 22 and 32 to the bonding portions 14. In this case, the reliability is highest with metal-to-metal bonding. In this case, between the semiconductor chips 20 and 30 and the substrate 10 is commonly filled with an underfill resin.

The external electrodes 40 are;provided on lands 16 of the interconnect pattern 12. In more detail, the external electrodes 40 are provided on the surface opposite to the surface where the interconnect pattern 12 is formed on the substrate 10, and are electrically connected to the lands 16 through the through holes 18. The electrical connection of the external electrodes 40 to the lands 16 is commonly achieved by providing solder balls together with flux on the through holes on the surface of the substrate opposite to that on which the semiconductor chips are mounted, and formed by a reflow process, but may equally be achieved by providing a conductive material such as gold or copper plated on the inner surface of the through holes 18. Alternatively, when solder balls are used as the external electrodes 40, the through holes 18 may be filled with the solder which is the material of the solder balls, and a conductive material formed integrally with the solder balls within the through holes 18.

Further, on the surface opposite to the semiconductor chip mounting surface, may be formed lands for external electrodes connected by via holes or through holes to the interconnect pattern 12, and external electrodes may be formed thereon. The external electrodes may equally be formed of a metal other than the solder described above, or of a conductive resin, or the like.

As described above, when all of the lands 16 are positioned within the mounting region of the semiconductor chips 20 and 30, the external electrodes 40 are also positioned within the mounting region of the semiconductor chips 20 and 30 (FAN-IN structure). When bonding portions 14 provided within the mounting region of some of the semiconductor chips 20 and 30 are connected to lands 16 provided within the mounting region, the external electrodes 40 are also electrically connected to electrodes 22 and 32 of semiconductor chips 20 and 30 corresponding to the mounting region in which the external electrodes 40 are provided.

According to this embodiment, the plurality of semiconductor chips 20 and 30 are aligned in the horizontal direction and mounted on the substrate 10, and the electrodes 22 and 32 of the semiconductor chips 20 and 30 are subjected to face-down bonding to the bonding portions 14. Therefore, since bonding is carried out within the region of the semiconductor chips 20 and 30, the area of the substrate 10 can be kept to the minimum required. As a result, the semiconductor device 1 can be made compact.

This embodiment has the above described construction, and one example of a method of manufacturing the same is now described. First, the substrate 10 having formed thereon the interconnect pattern 12 which has a plurality of bonding portions 14 and a plurality of lands 16 connected to the bonding portions 14 is provided in advance. Then on the surface of the substrate 10 on which the interconnect pattern 12 is formed, the anisotropically conductive material 50 is provided. In more detail, the anisotropically conductive material 50 is provided on at least the bonding portions 14.

The plurality of the semiconductor chips 20 and 30 having a plurality of electrodes 22 and 32 is provided in advance. The electrodes 22 and 32 are positioned over the bonding portions 14 of the anisotropically conductive material 50, and the semiconductor chips 20 and 30 are mounted on the substrate 10.

Next, at least one of the semiconductor chips 20 and 30 and the substrate 10 is pressed, and the bonding portions 14 and the electrodes 22 and 32 are electrically connected through the conductive particles of the anisotropically conductive material 50.

Then from the surface of the substrate 10 opposite to that on which the interconnect pattern 12 is formed, with through holes 18 interposed, the external electrodes 40 are formed on the lands 16.

By the above process, the semiconductor device 1 is obtained. According to this embodiment, since the bonding portions 14 and electrodes 22 and 32 are electrically connected by the anisotropically conductive material 50, a semiconductor device 1 can be manufactured by a method of outstanding reliability and manufacturing characteristics.

Second Embodiment

Figure 2A:
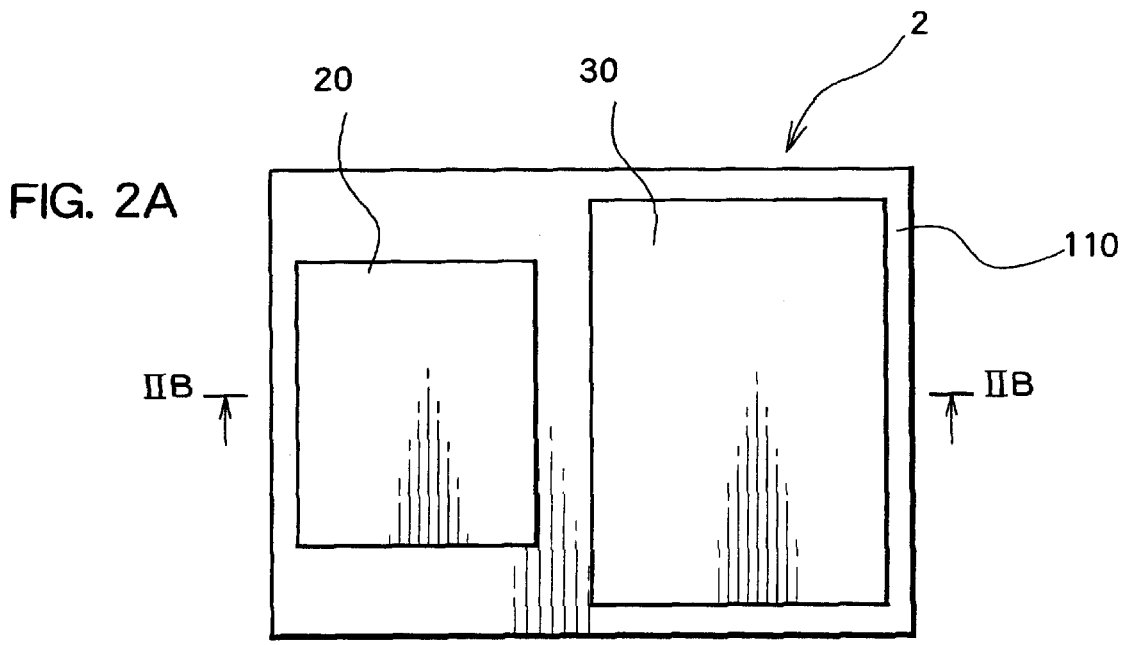
FIGS. 2A to 2C show a second embodiment of the semiconductor device to which the present invention is applied.
Figure 2B:
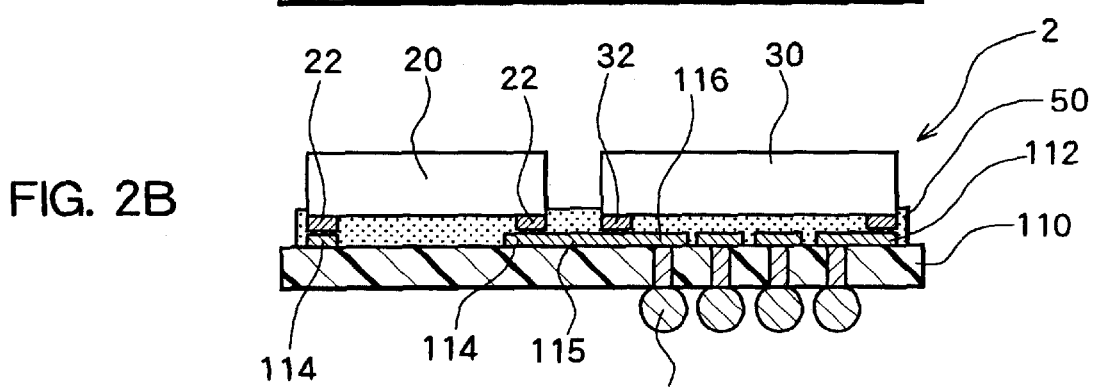
Figure 2C:
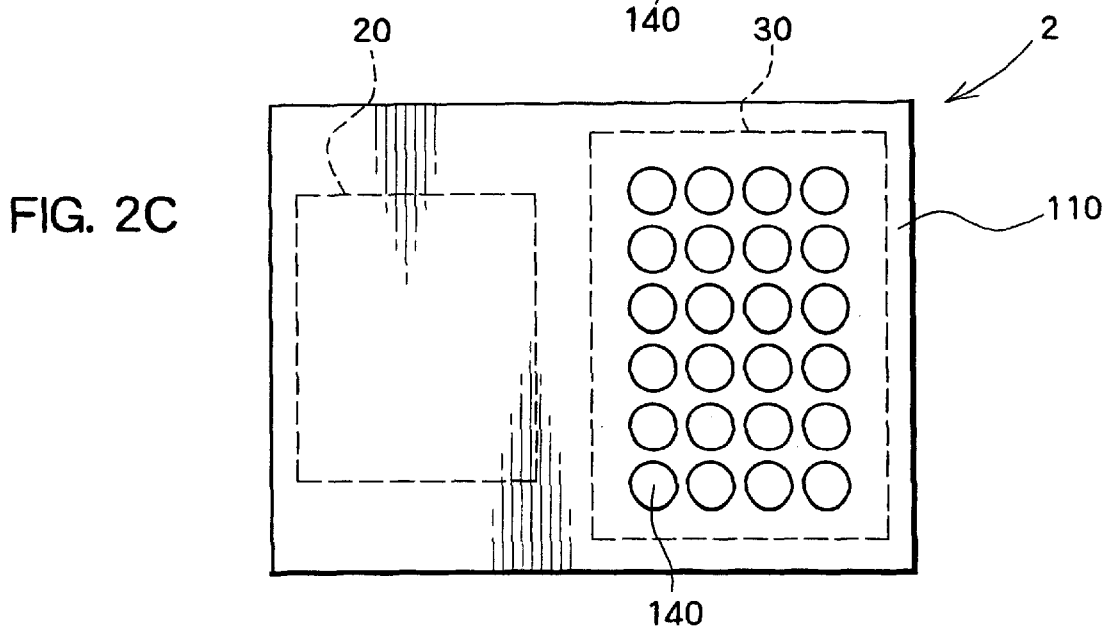

FIGS. 2A to 2C shows a second embodiment of the semiconductor device to which the present invention is applied. It should be noted that FIG. 2A is a plan view of the semiconductor device, FIG. 2B is a cross-sectional view along the line IIB—IIB in FIG. 2A, and FIG. 2C is a bottom view of the semiconductor device. A semiconductor device 2 includes a substrate 110, external electrodes 140, and the plurality (for example, two) of semiconductor chips 20 and 30 used in the first embodiment.

On the substrate 110 is formed an interconnect pattern 112. The interconnect pattern 112 includes bonding portions 114 and lands 116. The bonding portions 114 are provided in positions corresponding to the electrodes 22 and 32 of the semiconductor chips 20 and 30. On the other hand, the lands 116 are formed only within the mounting region of one of the semiconductor chips 20 and 30. Therefore, the lands 116 within this one of the mounting regions are electrically connected to the bonding portions 114 within the other of the mounting regions through interconnects 115.

Since the lands 116 are formed in this way, the external electrodes 140 are also formed only within the mounting region of one of the semiconductor chips 20 and 30. It should be noted that in FIG. 2C, for simplification a. reduced number of the external electrodes 140 are shown, and a larger number of the external electrodes 140 can actually be provided.

Other than this, the structure and method of manufacture is the same as in the first embodiment described above. Depending on the interconnect pattern of the mounting substrate or motherboard, it may be beneficial for all of the external electrodes 140 to be concentrated in a single location as in the second embodiment of the semiconductor device 2.

To prevent inclination of the semiconductor device due to a weight imbalance during mounting on the motherboard, a projection of the same size, height, and form as the external electrodes 140 may be formed on the surface of the substrate 110 opposite to that on which the semiconductor chip 20 is mounted. This projection may be formed of resin or tape or the like.

Third Embodiment

Figure 3A:
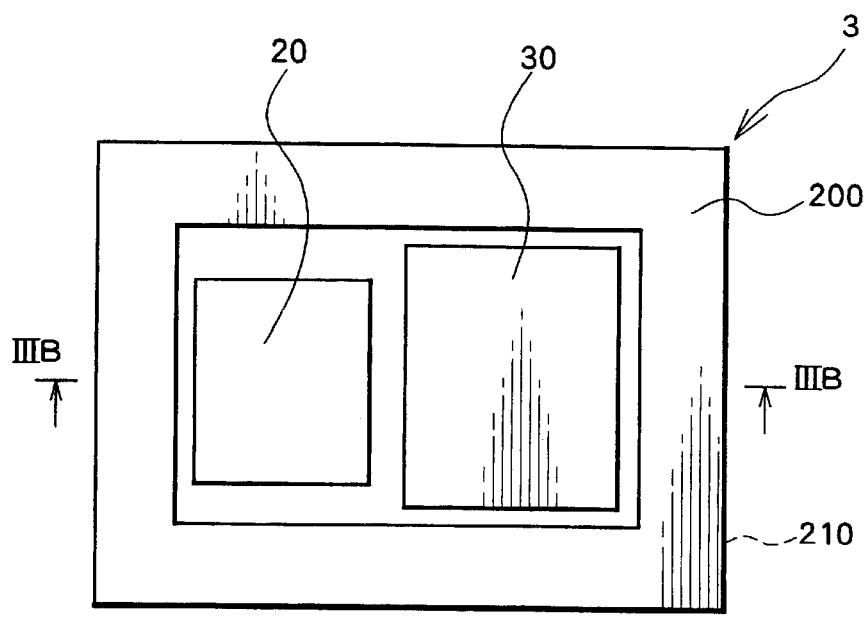
FIGS. 3A to 3C show a third embodiment of the semiconductor device to which the present invention is applied.
Figure 3B:
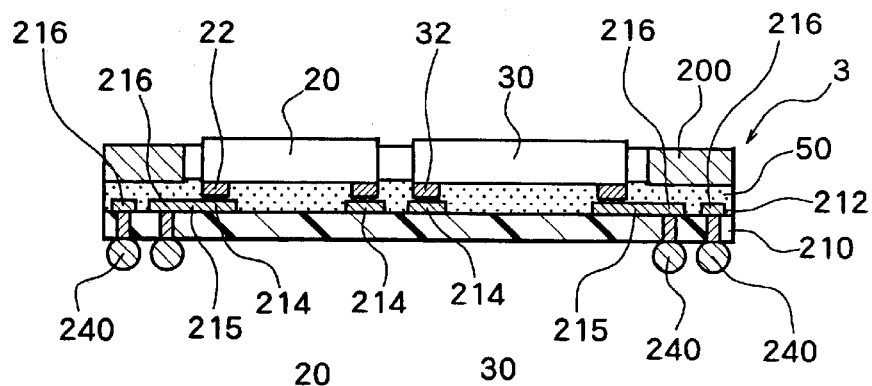
Figure 3C:
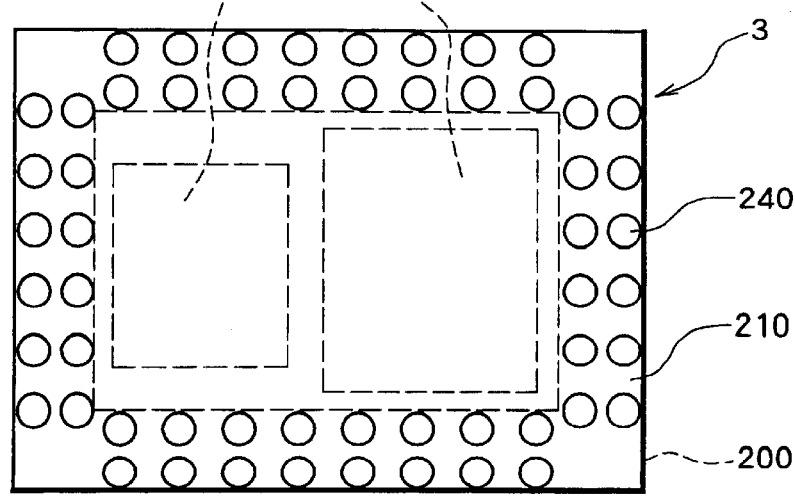

FIGS. 3A to 3C show a third embodiment of the semiconductor device to which the present invention is applied. It should be noted that FIG. 3A is a plan view of the semiconductor device, FIG. 3B is a cross-sectional view along the line IIIB—IIIB in FIG. 3A, and FIG. 3C is a bottom view of the semiconductor device. A semiconductor device 3 includes a substrate 210, external electrodes 240, and the plurality (for example, two) of semiconductor chips 20 and 30 used in the first embodiment.

On the substrate 210 is formed an interconnect pattern 212. The interconnect pattern 212 includes bonding portions 214 and lands 216. The bonding portions 214 are provided in positions corresponding to the electrodes 22 and 32 of the semiconductor chips 20 and 30. On the other hand, the lands 216 are formed on the outside of the mounting region of the semiconductor chips 20 and 30. Therefore, the bonding portions 214 within the mounting region of the semiconductor chips 20 and 30 and the lands 216 positioned outside this mounting region are electrically connected through interconnects 215. The substrate 210 is formed to be larger than the mounting region of the semiconductor chips 20 and 30.

Since the lands 216 are formed in this way, the external electrodes 240 are also formed outside the mounting region of the semiconductor chips 20 and 30 (FAN-OUT structure). It should be noted that in FIG. 3C, for simplification a reduced number of the external electrodes 240 are shown, and in practice a larger number of the external electrodes 240 can be provided.

On the substrate 210 is provided a flat support member 200 which is rigid, for example of metal. The flat support member 200 serves to reinforce the substrate 210 and maintain flatness, so that as long as it is rigid there are no restrictions on the material. For example, a metal such as stainless steel or a copper alloy is commonly used, but this may also be formed of plastic, ceramic, or another insulating material. In this embodiment, the anisotropically conductive material 50 is provided on the interconnect pattern 212, and when there is no conduction from the conductive particles of the anisotropically conductive material 50, even if a metal flat support member 200 is used, electrical conduction between the interconnect pattern 212 and the flat support member 200 can be prevented. Alternatively, when the flat support member 200 is formed of an insulating material, there may be an electrical connection from the conductive particles of the anisotropically conductive material 50. By forming an insulation layer at least on the contact surface with the anisotropically conductive material 50 on the flat support member 200, electrical conduction between the interconnect pattern 212 and the flat support member 200 can be prevented even if the flat support member 200 is of metal. The flat support member 200 may be adhered to the substrate 210 with a general insulating adhesive other than the anisotropically conductive material.

The flat support member 200 is adhered outside the mounting region of the semiconductor chips 20 and 30 or the on the periphery of the substrate 210 by the anisotropically conductive material 50. Therefore, even if the substrate 210 is a flexible substrate, the flatness of the portion outside the semiconductor chips 20 and 30 and the periphery of the substrate 210 can be assured. In this embodiment, the flatness of the region of the substrate 210 in which the external electrodes 240 are provided is assured by the flat support member 200, as a result of which the uniform height (coplanarity) of the external electrodes 240 can be assured. Other than this, the structure and method of manufacture is the same as in the first embodiment described above, and description is omitted.

Figure 4:
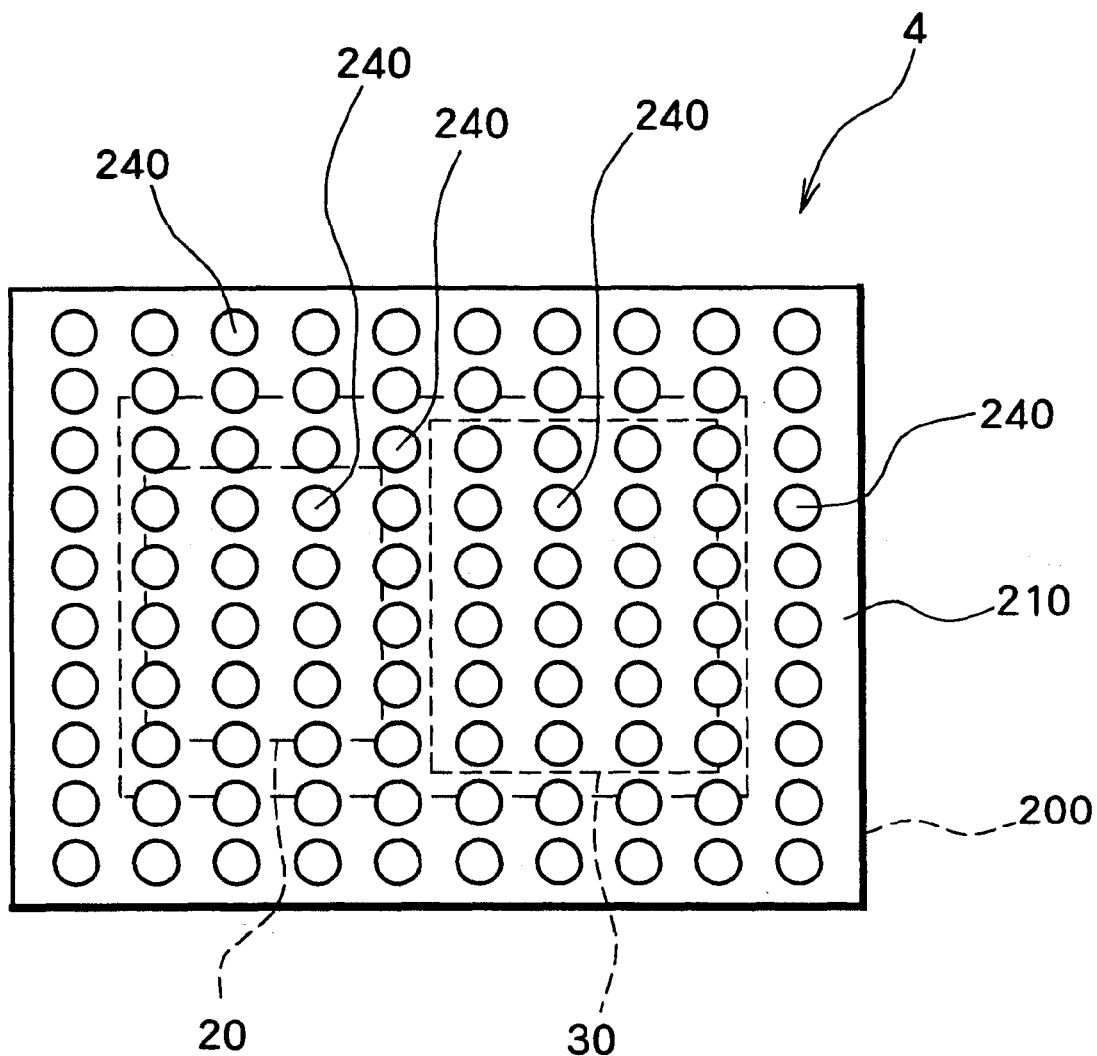
FIG. 4 shows a modification of the third embodiment to which the present invention is applied.

It should be noted that in this embodiment, in the mounting region of the semiconductor chips 20 and 30 on the substrate 210, no external electrodes 240 are provided, but in this region also, external electrodes may be provided (FAN-IN/OUT structure). In addition, or as an alternative, external electrodes may be provided in the region between the semiconductor chip 20 and the semiconductor chip 30. The semiconductor device 4 shown in FIG. 4 is an example showing the external electrodes 240 provided inside and outside of the mounting region of the semiconductor chips 20 and 30 and between the semiconductor chips 20 and 30 on the substrate 210.

It should be noted that in the third embodiment, when the substrate 210 itself has flatness retaining properties (for example when the substrate 210 is of ceramic or glass epoxy), then the flat support member 200 is not necessarily required.

Fourth Embodiment

Figure 5:
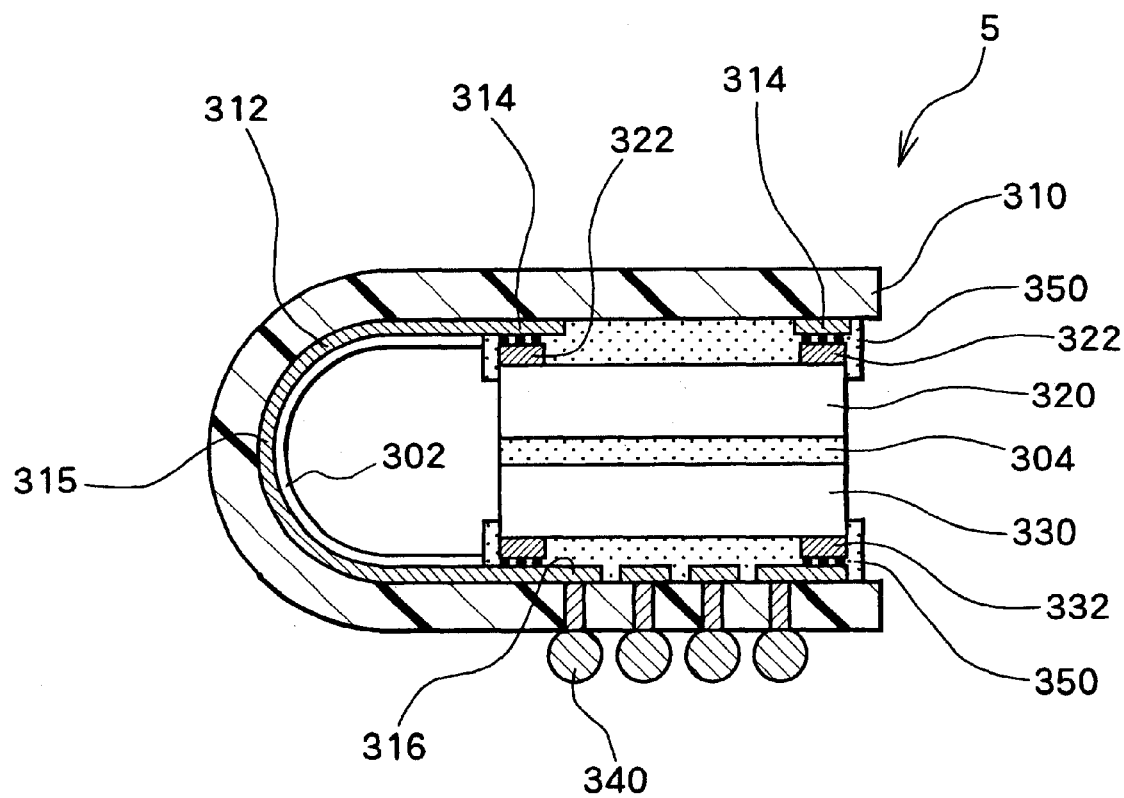
FIG. 5 shows a fourth embodiment of the semiconductor device to which the present invention is applied.
Figure 6A:
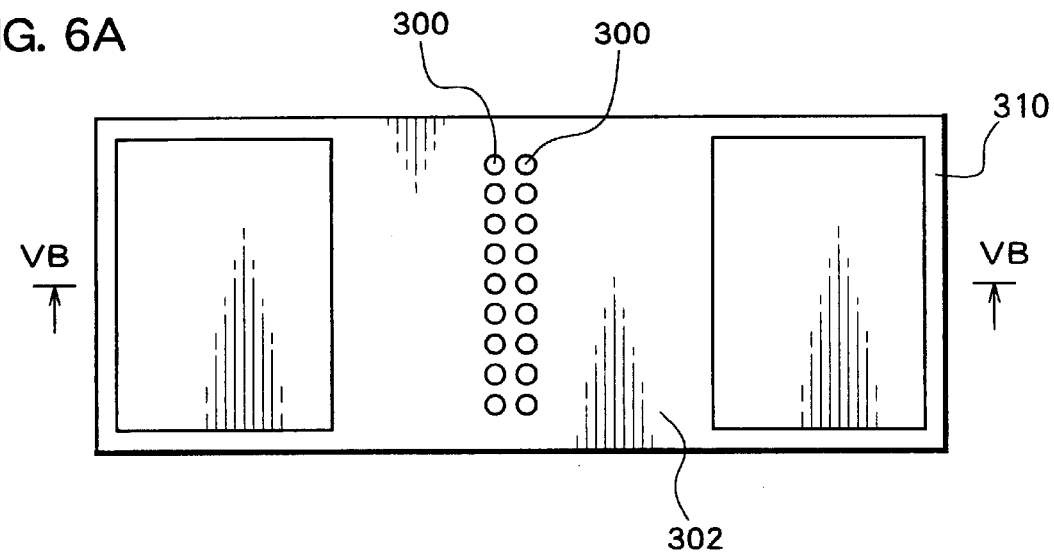
FIGS. 6A to 6C show a development of a fourth embodiment of the semiconductor device to which the present invention is applied.
Figure 6B:
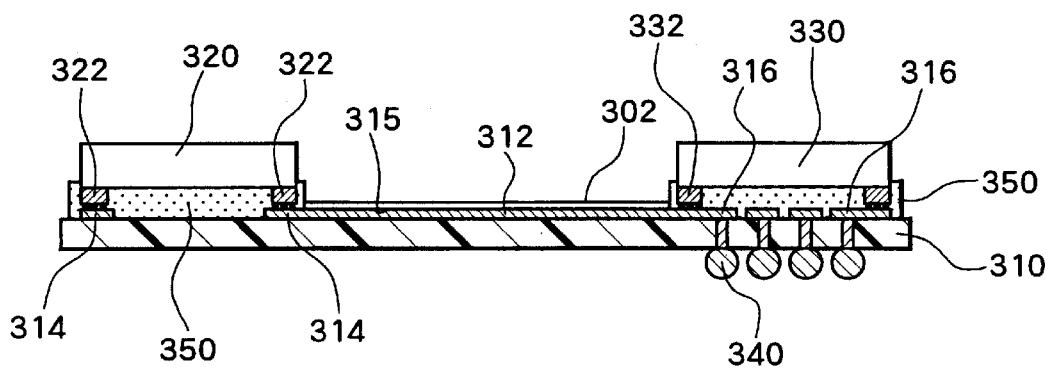
Figure 6C:
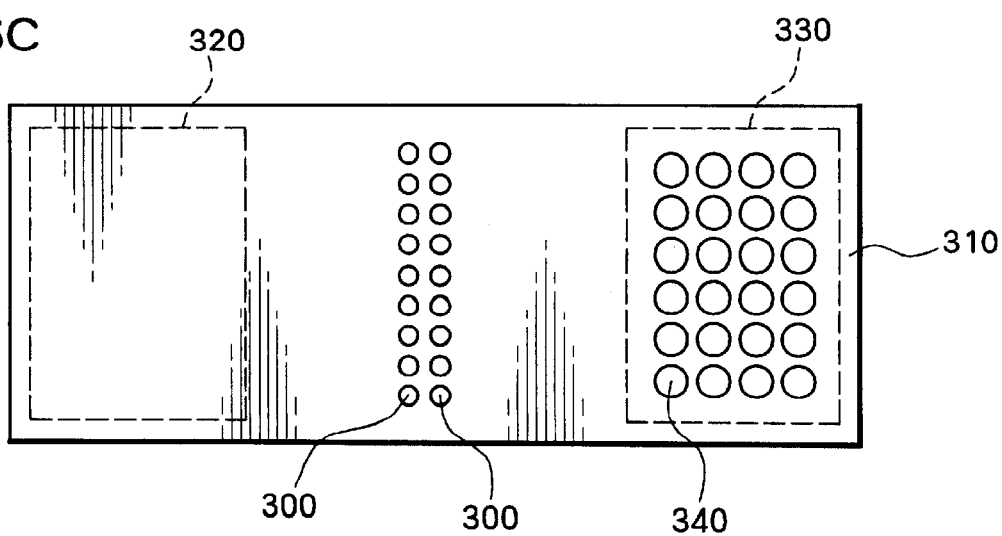

FIG. 5 shows a fourth embodiment of the semiconductor device to which the present invention is applied, and FIGS. 6A to 6C show a development of the substrate of the semiconductor device shown in FIG. 5. It should be noted that FIG. 6A is a plan view, FIG. 6B is a cross-sectional view along the line VB—VB in FIG. 6A, and FIG. 6C is a bottom view. A semiconductor device 5 includes a substrate 310, semiconductor chips 320 and 330, and external electrodes 340.

The substrate 310, is as shown in FIG. 5 formed of a material which can be bent, and in particular in the case of a two-layer flexible substrate or in the case that the interconnect density is required to be further increased, a built-up. type of flexible substrate is preferable. The substrate 310 forms an oblong shape, longer in one direction. At both ends of this substrate 310, the semiconductor chips 320 and 330 are mounted. It should be noted that in this embodiment the semiconductor chips 320 and 330 are of the same size and the same shape, but may equally be of a different size or different shape.

An interconnect pattern 312 is formed on the substrate 310. The interconnect pattern 312 includes bonding portions 314 and lands 316. The bonding portions 314 are provided in positions corresponding to electrodes 322 and 332 of the semiconductor chips 320 and 330, and are electrically connected through an anisotropically conductive material 350. On the other hand, the lands 316 are formed only within the mounting region of one of the semiconductor chips 320 and 330. For this reason, the lands 316 within this one mounting region and the bonding portions 314 within the other mounting region are electrically connected through interconnects 315. The interconnects 315 are formed between the semiconductor chips 320 and 330, and are not covered thereby, and are protected by being covered by a protective layer 302 of resist or the like.

Since the lands 316 are formed in this way, the external electrodes 340 are also formed only within the mounting region of one of the semiconductor chips 320 and 330. It should be noted that in the drawing, for simplification a reduced number of the external electrodes 340 are shown, and in practice a larger number of the external electrodes 340 can be provided. With regard to the disposition of the external electrodes 340, as described in the third embodiment, they may equally be disposed using a flat support member on the outside of the semiconductor chip.

In this embodiment, the region of the substrate 310 between the semiconductor chips 320 and 330 is bent so that the surface of the substrate 310 on which the semiconductor chips 320 and 330 are mounted forms a V-shape. It should be noted that in the drawing, the substrate 310 is bent gradually without forming a crease, but equally the substrate 310 may form a crease. In the substrate 310, as shown in FIGS. 6A and 6C, in the bending region at least one, or a plurality of holes 300 may be formed. By this means, the resilience of the substrate 310 is reduced, and it can be more easily bent, and becomes easier to hold the bent form. It should be noted that the interconnects 315 are preferably formed so as to avoid the holes 300, but the interconnects 315 may be formed over the holes 300.

The substrate 310 is bent, and the surface of the semiconductor chip 320 opposite to the surface on which the electrodes 322 are formed, and the surface of the semiconductor chip 330 opposite to the surface on which the electrodes 332 are formed are adhered by an adhesive 304. The bent form of the substrate 310 is maintained by the adhesive force of the adhesive 304. Since the surfaces of the semiconductor chips 320 and 330 are flat, the adhesion is easy to achieve. When the adhesive 304 is an electrically conductive adhesive, the potential of the adhered surfaces of the semiconductor chips 320 and 330 can be made the same. When the adhesive 304 is a thermally conductive adhesive, heat can be transferred between the semiconductor chips 320 and 330. For example, when one of the semiconductor chips 320 and 330 emits more heat and the other emits less heat, then cooling can be achieved by passing heat from the one to the other. The adhesive 304 may equally be a pressure-sensitive adhesive. The adhesive 304 in sheet form or liquid form is applied to the back surfaces of the semiconductor chips 320 and 330 in the state shown in FIGS. 6A to 6C, and thereafter the back surfaces of the both semiconductor chips are adhered together. Alternatively, back surfaces of the semiconductor chip may be positioned together and then the gap filled with the adhesive 304 in liquid form.

Except for the above described points, the construction is the same as in the first embodiment described above, and description is omitted. It should be noted that semiconductor chips of different sizes may be used, but in this case when the larger semiconductor chip is disposed on the side of formation of the external electrodes 340, this will give greater geometrical stability, and is preferable.

In this embodiment, two semiconductor chips 320 and 330 are used, but a plurality of more than two semiconductor chips may also be used. In such a case, the surface of one semiconductor chip opposite to the surface on which the electrodes are formed may be adhered to the surface of one or more of the remaining plurality of semiconductor chips opposite to the surface on which the electrodes are formed. By means of such a formation, a plurality, and in particular a large number of semiconductor chips can be superimposed within a small area.

Further, without bending and superimposing the substrate for each single semiconductor chip, a plurality of semiconductor chips may be mounted on plane, and then the substrate bent and superimposed.

In this embodiment of the semiconductor device 5, a plurality of the semiconductor chips 320 and 330 are superimposed, and therefore even more compactness can. be achieved than in the previous embodiments. It should be noted that for the method of manufacturing the semiconductor device 5, the same method can be applied as that described in the first embodiment, except for the bending of the substrate 310.

Fifth Embodiment

Figure 7:
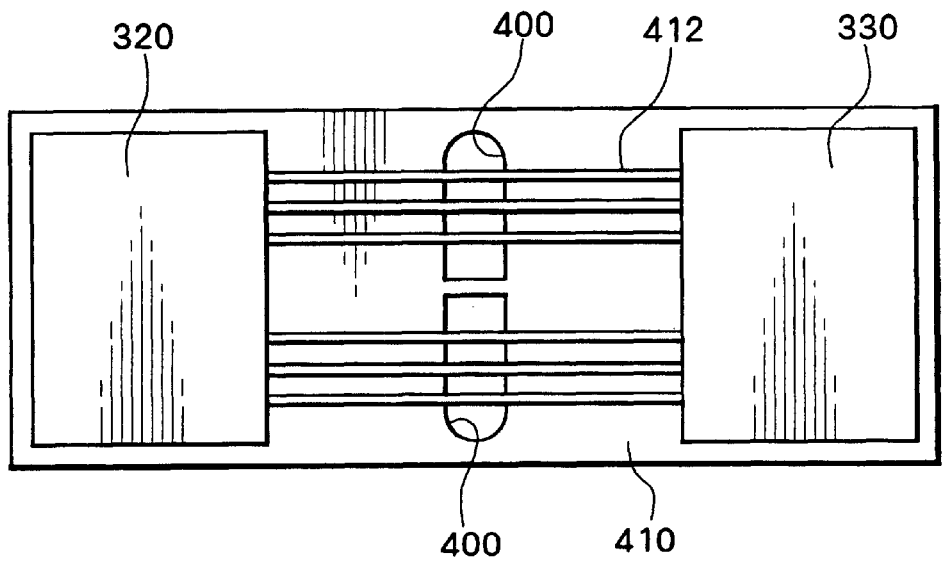
FIG. 7 shows a development of a fifth embodiment of the semiconductor device to which the present invention is applied.

FIG. 7 is a development of a fifth embodiment of the substrate of the semiconductor device to which the present invention is applied. In this embodiment of the semiconductor device also, as with the semiconductor device 5 shown in FIG. 5, a substrate 410 is in a bent configuration. On the substrate 410, as in the fourth embodiment, the semiconductor chips 320 and 330 are mounted.

In the substrate 410 shown in FIG. 7, at least one hole 400 is formed. The hole 400 is a slot extending along the bending line of the substrate 410. In other words, the substrate 410 is bent along the hole 400 which is a slot. In FIG. 7, a plurality of holes 400 is aligned. Since the holes 400 are formed inside a side edge of the substrate 410, an edge portion of the substrate 410 remains. Therefore, the substrate 410 remains connected without being divided apart.

On the substrate 410 an interconnect pattern 412 is formed. The interconnect pattern 412 is formed to pass over the holes 400. Since the substrate 410 is connected even with the holes 400 formed, the interconnect pattern 412 is not divided.

When the substrate 410 of the above construction is bent as the substrate 310 in FIG. 5, the edge where the holes 400 are formed forms part of the outer edge of the semiconductor device. Therefore, since the semiconductor device forms a clear outline, positioning is easy.

To other aspects of the embodiment, the description under the fourth embodiment can be applied.

Sixth Embodiment

Figure 8:
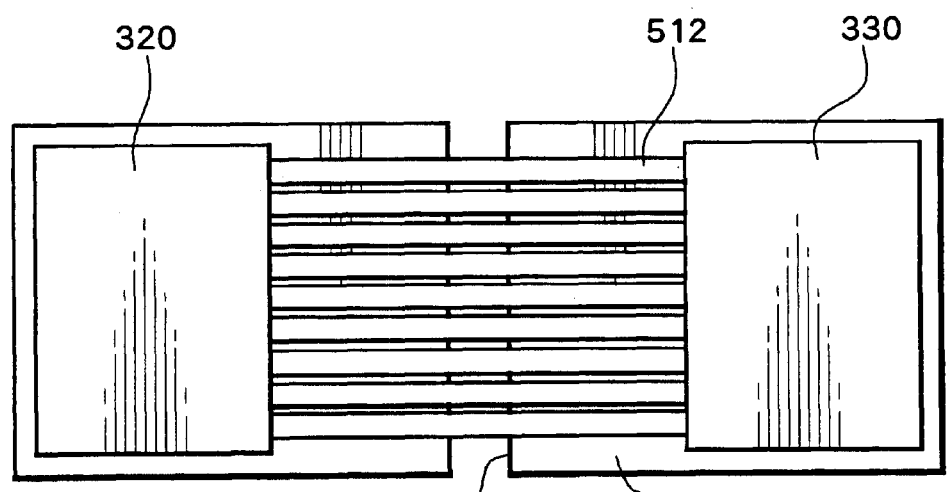
FIG. 8 shows a development of a sixth embodiment of the semiconductor device to which the present invention is applied.

FIG. 8 is a development of a sixth embodiment of the substrate of the semiconductor device to which the present invention is applied. In this embodiment of the semiconductor device also, as with the semiconductor device 5 shown in FIG. 5, a substrate 510 is in a bent configuration. on the substrate 510, as in the fourth embodiment, the semiconductor chips 320 and 330 are mounted.

The substrate 510 shown in FIG. 8 has a slit 500 formed, whereby it is divided. In other words, the both dividing edges of the substrate 510 is spaced apart whereby the slit 500 is formed. The slit 500. extends along the bending line of the substrate 510. In other words, the substrate 510 is bent along the slit 500.

On the substrate 510, an interconnect pattern 512 is formed. The interconnect pattern 512 is formed to pass over the slit 500. Since the substrate 510 is divided, it is preferable for the width of the interconnect pattern 512 to be greater than the width of the interconnect pattern 412 shown in FIG. 7.

When the substrate 510 of the above construction is bent as the substrate 310 in FIG. 5, the edge where the slit 500 is formed forms part of the outer edge of the semiconductor device. Therefore, since the semiconductor device forms a clear outline, positioning is easy.

To other aspects of the embodiment, the description under the fourth embodiment can be applied.

Seventh Embodiment

Figure 9:
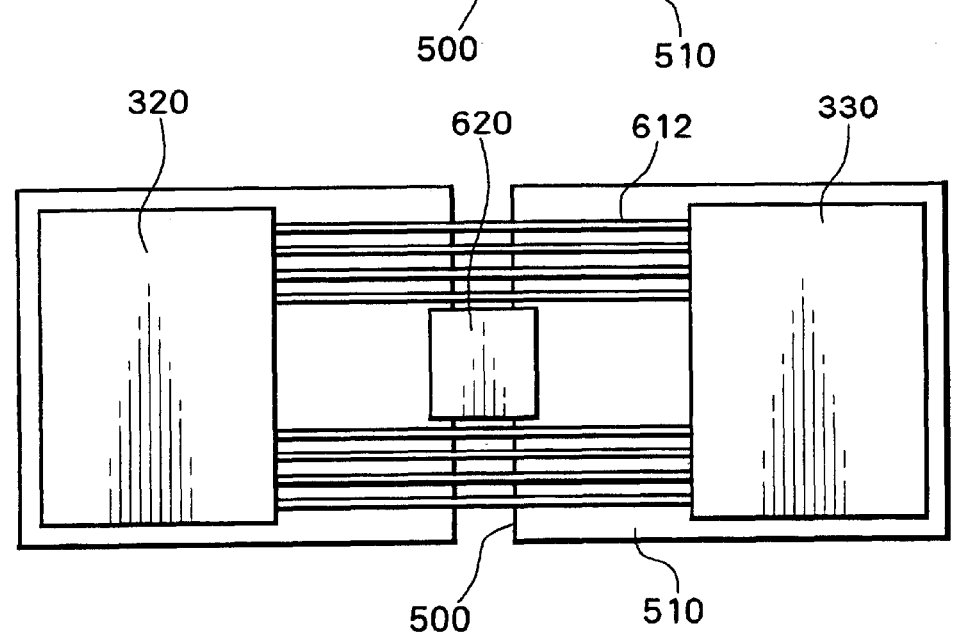
FIG. 9 shows a development of a seventh embodiment of the semiconductor device to which the present invention is applied.

FIG. 9 is a development of a sixth embodiment of the substrate of the semiconductor device to which the present invention is applied. This embodiment differs from the sixth embodiment in that a joining member 620 is provided, spanning the slit 500 of the substrate 510 shown in FIG. 8. By the provision of the joining member 620, the substrate 510 which has been divided is joined and reinforced. Therefore, the width of an interconnect pattern 612 may be less than the width of the interconnect pattern 512 shown in FIG. 8. The joining member 620 may be formed of the same material as the interconnect pattern 612. When the interconnect pattern 612 is formed by etching of a metal foil such as copper foil, the joining member 620 may be formed at the same time, thus not requiring the number of processes to be increased.

To other aspects of the embodiment, the description under the sixth embodiment can be applied. In this embodiment, the joining member 610 has been described spanning the slit 500 separating the substrate 510, but the joining member 610 may equally span holes 400 (see FIG. 7) which do not separate the substrate 510. Such holes 400 may also be termed "slits."

Eighth Embodiment

Figure 10:
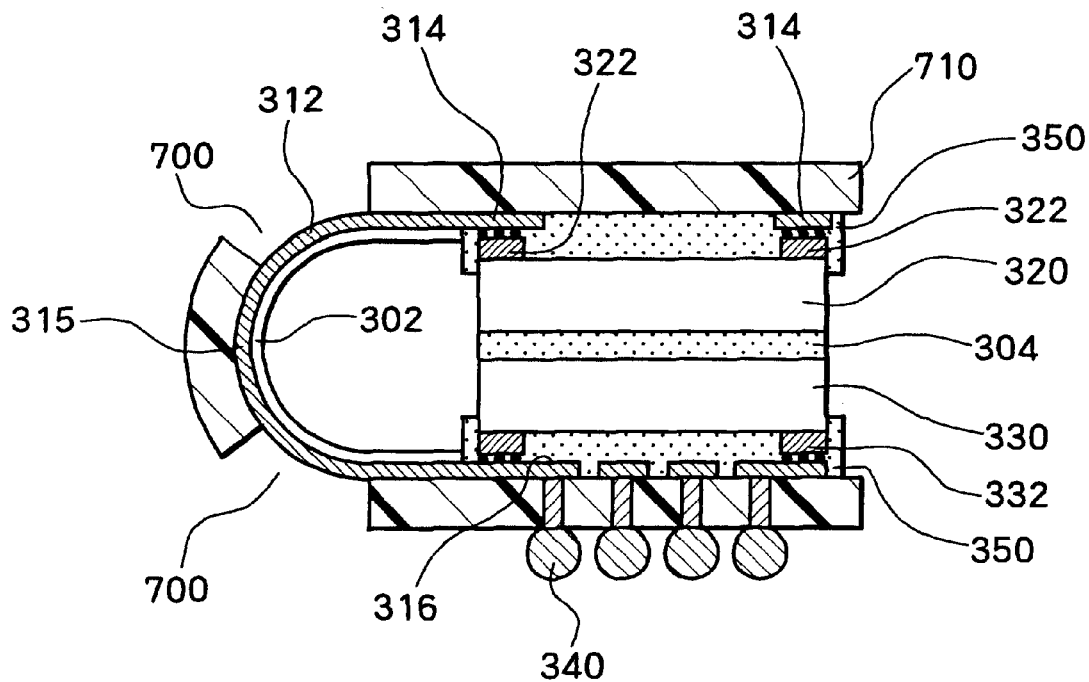
FIG. 10 shows an eighth embodiment of the semiconductor device to which the present invention is applied.

FIG. 10 shows an eighth embodiment of the semiconductor device to which the present invention is applied. The semiconductor device shown in FIG. 10 has the same configuration as the semiconductor device 5 shown in FIG. 5, except for a substrate 710 and hole 700.

In the substrate 710, in the region of bending, a plurality of holes 700 is formed. The plurality of holes 700 comprise slots extending along the bending line, in a in a parallel formation. Alternatively, the holes 700 may be termed "slits," and in place of the holes 700, slits dividing the substrate 710 may be formed. By the formation of such holes (or slits) 700, the substrate 710 is made easier to bend. The interconnect pattern 312 passes over the holes 700. In this embodiment the description referring to FIG. 5 can also be applied.

Ninth Embodiment

Figure 11:
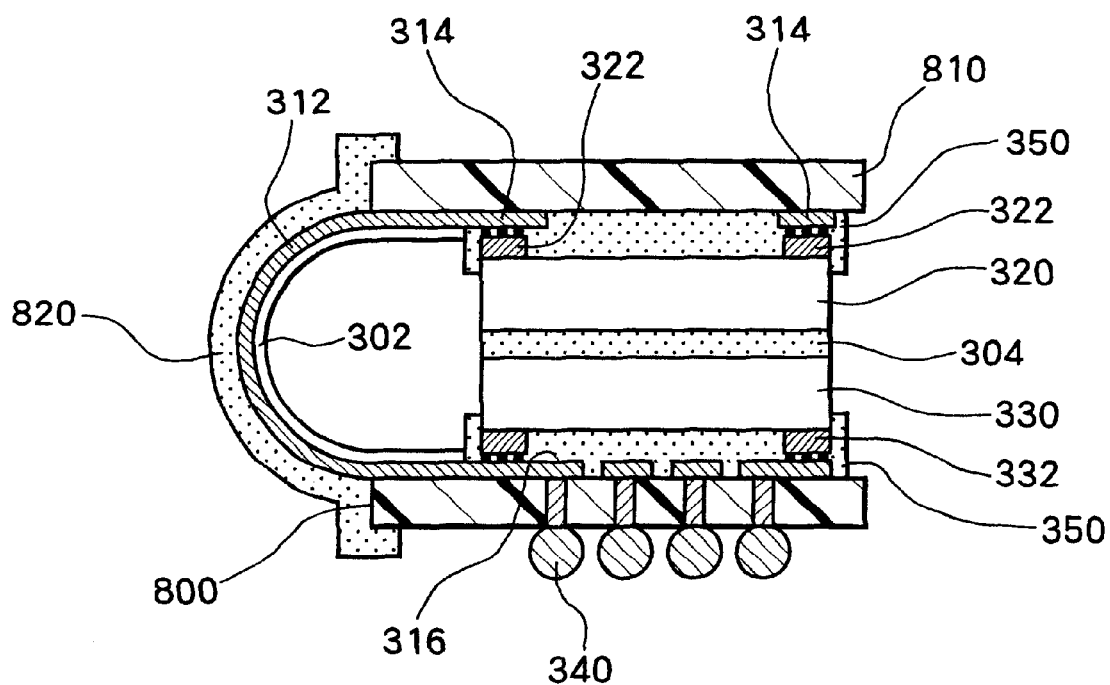
FIG. 11 shows a ninth embodiment of the semiconductor device to which the present invention is applied.

FIG. 11 shows a ninth embodiment of the semiconductor device to which the present invention is applied. In the semiconductor device shown in FIG. 11, with a hole 800 formed in a substrate 810 interposed, a flexible resin 820 is provided on the interconnect pattern 312. As the resin 820 for example a soft polyimide resin may be used.

The hole 800 is formed in the region where the substrate 810 is bent. The hole 800 may be termed a "slit," and in place of the hole 800, a slit dividing the substrate 810 may be formed.

In this embodiment, the interconnect pattern 312 is formed on the inside of the bent portion of the substrate 810, and therefore without the resin 820, the interconnect pattern 312 would be exposed to the exterior through the hole 800. But here the provision of the resin 820 within the hole 800 enables the interconnect pattern 312 to be protected. Moreover, since the resin 820 is flexible, the resin 820 can be provided while the substrate 810 is still opened up in the flat state, and the substrate 810 bent thereafter, improving the working efficiency. It should be noted that the description of this embodiment can also be applied to the other embodiments.

The present invention can be applied to a face-down type of semiconductor device or to the module construction thereof. As a face-down type semiconductor device may be cited, for example, COF (Chip On Flex/Film) construction or COB (Chip On Board) construction.

In these embodiments, a semiconductor device having external electrodes has been described, but a part of the substrate may be extended and used for external connection. A part of the substrate may be used as a connector lead, connectors may be mounted on the substrate, or the substrate interconnect pattern itself may be connected to another electronic instrument.

Furthermore, the formation of external connectors may be eliminated, and using a solder cream applied on the motherboard at the time of mounting on the motherboard, external terminals may be formed as a result of surface tension during the fusion thereof. This semiconductor device is a so-called "land grid array" type of semiconductor device.

Figure 12:
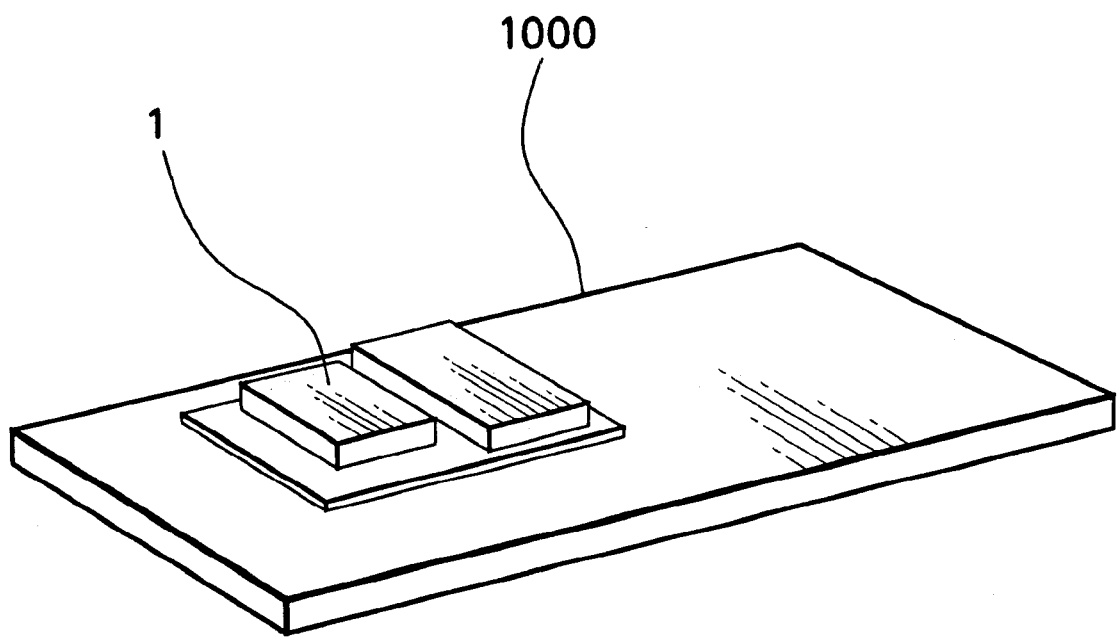
FIG. 12 shows a circuit board on which the semiconductor device of this embodiment is mounted.

In FIG. 12 shows a circuit board 1000 on which the first embodiment of the semiconductor device 1 is mounted. For the circuit board 1000, an organic substrate such as a glass epoxy substrate or the like is generally used. On the circuit board 1000, an interconnect pattern of for example copper is formed to constitute a desired circuit. Then by mechanical connection of corresponding parts of the interconnect pattern and external electrodes 40 (see FIG. 1B) of the semiconductor device 1, electrical connection thereof is achieved.

It should be noted that the semiconductor device 1 has a mounting area which can be made as small as the area for mounting a bare chip, and therefore by using this circuit board 1000 for an electronic instrument, the electronic instrument itself can be made more compact. Within the same area, a larger mounting space can be obtained, and therefore higher functionality is possible.

Figure 13:
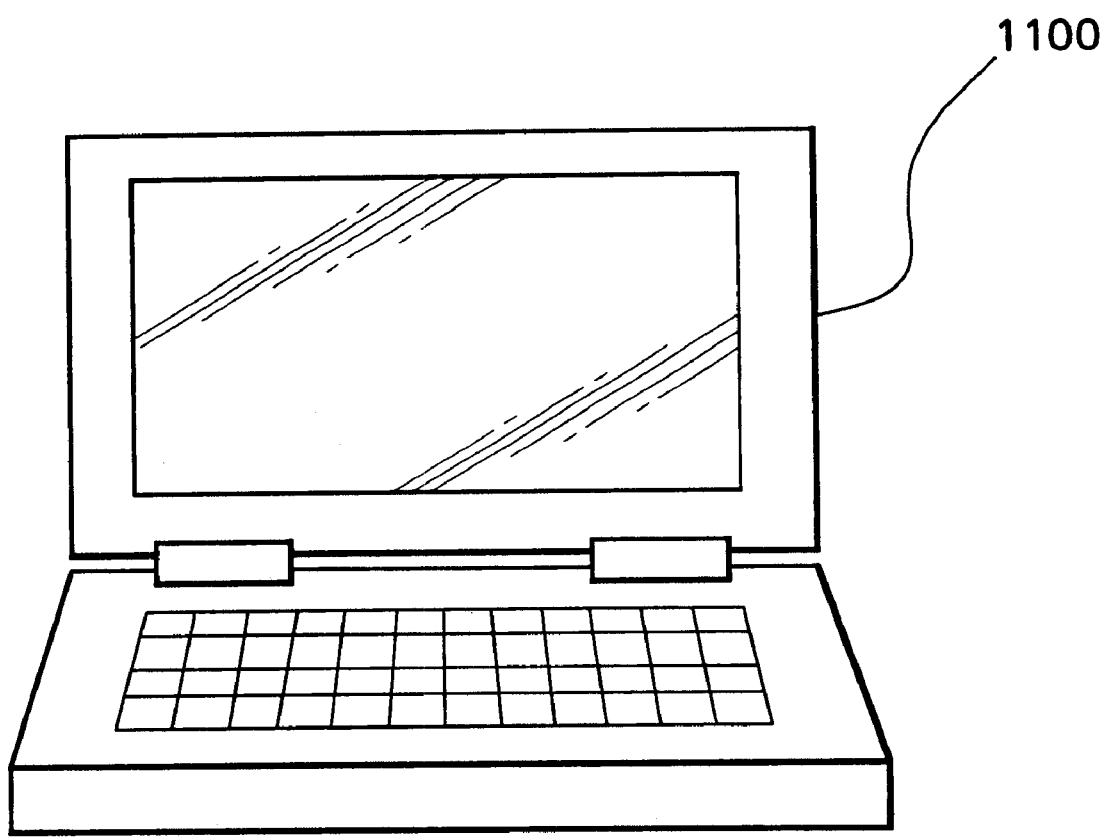
FIG. 13 shows an electronic instrument having a circuit board on which the semiconductor device of this embodiment is mounte.

Then as an electronic instrument equipped with this circuit board 1000, FIG. 13 shows a notebook personal computer 1100.

It should be noted that the above embodiments are examples of the present invention applied to a semiconductor device, but the present invention can be applied to any surface-mounted electronic component requiring a large number of external electrodes as in the case of a semiconductor device, whether an active component or passive component. As electronic components, for example, may be cited resistors, capacitors, coils, oscillators, filters, temperature sensors, thermistors, varistors, variable resistors, and fuses.

In all of the above-described embodiments, as the method of mounting the semiconductor chip, face-down bonding is applied, but equally wire bonding, or TAB (Tape Automated Bonding), or similar mounting methods can be applied. A mounted module type of semiconductor device in which a combination of the above-described semiconductor chips and electronic components other than semiconductor chips is mounted may be configured.

What is claimed is:

1. A semiconductor device comprising:

a plurality of semiconductor chips having electrodes, and aligned in a horizontal direction for face-down bonding;

a substrate on which an interconnect pattern is formed, the interconnect pattern having bonding portions to which the electrodes of the semiconductor chip are connected, and lands to which the bonding portions are electrically connected; and external electrodes provided on the lands, wherein the external electrodes are disposed within a region where any one of the semiconductor chips is mounted;

wherein the substrate is a flexible substrate and part of the substrate is bent;

wherein a surface of the one semiconductor chip, which is disposed at a region where the external electrodes are provided, opposite to a surface on which the electrodes are formed is attached to a surface of at least one remaining semiconductor chip opposite to a surface on which the electrodes are formed; and wherein the substrate has at least one hole formed within a region to be bent.

2. The semiconductor device as defined in claim 1, wherein the hole is a slot extending along a bending line;

wherein the interconnect pattern is formed to pass over the hole; and wherein an edge of the slot extending along the bending line forms a part of an outer edge.

3. The semiconductor device as defined in claim 1, wherein a plurality of the holes are formed;

wherein the interconnect pattern is formed to pass over the plurality of holes; and wherein the holes are slots extending along a bending line, and are aligned.

4. The semiconductor device as defined in claim 2, wherein a flexible resin is provided on the interconnect pattern in the hole; and wherein the resin is bent together with the substrate.

5. A circuit board on which the semiconductor device as defined in claim 1 is mounted.

6. An electronic instrument on which the circuit board as defined in claim 5 is mounted.

7. A semiconductor device comprising:

a plurality of semiconductor chips having electrodes, and aligned in a horizontal direction for face-down bonding;

a substrate on which an interconnect pattern is formed, the interconnect pattern having bonding portions to which the electrodes of the semiconductor chip are connected, and lands to which the bonding portions are electrically connected; and external electrodes provided on the lands, wherein the external electrodes are disposed within a region where any one of the semiconductor chips is mounted;

wherein the substrate is a flexible substrate and part of the substrate is bent;

wherein a surface of the one semiconductor chip, which is disposed at a region where the external electrodes are provided, opposite to a surface on which the electrodes are formed is attached to a surface of at least one remaining semiconductor chip opposite to a surface on which the electrodes are formed;

wherein the substrate has a slit formed within a region to be bent; and wherein the substrate is divided by the slit, and a gap is opened up between opposing divided edges.

8. The semiconductor device as defined in claim 7, wherein a joining member is provided spanning the slit.

9. A circuit board on which the semiconductor device as defined in claim 7 is mounted.

10. An electronic instrument on which the circuit board as defined in claim 9 is mounted.

* * * * *